(12) United States Patent
Filoramo et al.

(10) Patent No.: US 11,552,628 B2
(45) Date of Patent: Jan. 10, 2023

(54) ELECTRICAL SWITCHING SYSTEMS INCLUDING CONSTANT-POWER CONTROLLERS AND ASSOCIATED METHODS

(71) Applicant: Maxim Integrated Products, Inc., San Jose, CA (US)

(72) Inventors: Pietro Filoramo, Syracuse (IT); Benedetto Marco Marietta, Aci Sant'antonio (IT); Carmelo Francesco Maria Marchese, Catania (IT); Angelo Genova, Mascalucia (IT)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 17/197,469

(22) Filed: Mar. 10, 2021

(65) Prior Publication Data

US 2021/0288638 A1 Sep. 16, 2021

Related U.S. Application Data

(60) Provisional application No. 62/987,491, filed on Mar. 10, 2020.

(51) Int. Cl.
*H03K 17/0812* (2006.01)
*H03K 17/0412* (2006.01)

(52) U.S. Cl.
CPC . *H03K 17/08122* (2013.01); *H03K 17/04123* (2013.01)

(58) Field of Classification Search
CPC ....... H03K 17/08122; H03K 17/04123; H03K 17/0822; H03K 17/04206; H02H 7/10; H02H 7/205
See application file for complete search history.

(56) References Cited

U.S. PATENT DOCUMENTS

2008/0204087 A1* 8/2008 Schwarzer ......... H03K 17/0828
327/109
2019/0074827 A1* 3/2019 Norling ................ H03K 17/165

* cited by examiner

*Primary Examiner* — Metasebia T Retebo
(74) *Attorney, Agent, or Firm* — Lathrop GPM LLP (57) ABSTRACT

An electrical switching system includes a constant-power controller and a switching device electrically coupled between a first node and a second node. The constant-power controller is configured to (a) generate a digital control signal to control the switching device, (b) control a duration of an active phase of the digital control signal at least partially based on a voltage across the switching device, and (c) control a peak value of the digital control signal to regulate a peak magnitude of current flowing through the switching device.

19 Claims, 10 Drawing Sheets

Generate a 1st Signal Representing a Voltage Across the Switching Device
1202

Generate a 2nd Signal Representing a Magnitude of Current Flowing Through the Switching Device
1204

Generate a 3rd Signal Representing a Difference Between the 2nd Signal and Reference Signal
1206

Generate a Digital Control Signal to Control the Switching Device Such that (a) an Amount of Time that the Digital Control Signal is Asserted is at Least Partially Based on the 1st Signal and (b) a Magnitude of the Digital Control Signal When the Digital Control Signal is Asserted is at Least Partially Based on the 3rd Signal
1208

ELECTRICAL SWITCHING SYSTEMS INCLUDING CONSTANT-POWER CONTROLLERS AND ASSOCIATED METHODS

RELATED APPLICATIONS

This application claims benefit of priority to U.S. Provisional Patent Application Ser. No. 62/987,491 filed on Mar. 10, 2020, which is incorporated herein by reference.

BACKGROUND

Switching devices, such as transistors, are commonly used to control flow of current in electrical circuits. For example, a switching device may serve as a circuit breaker to interrupt flow of current in an electrical circuit, such as in response to a fault or an overload condition. Switching devices are sometimes electrically coupled to energy storage devices, such as capacitors, inductors, and/or batteries. Accordingly, a switching device may need to handle a large current magnitude associated with charging and/or discharging an energy storage device.

DETAILED DESCRIPTION OF THE EMBODIMENTS

A switching device, such as a transistor, may be damaged by high current magnitude, such as from exceeding a safe operating area (SOA) of the switching device and/or from heating associated with power dissipation in the switching device. Likelihood of damage may be particularly acute in applications where a switching device is electrically coupled to an energy storage device and the switching device is subjected to a large current magnitude during charging or discharging of the energy storage device. A switching device may also be particularly prone to damage in a high voltage application because power dissipation in the switching device is proportional to magnitude of voltage across the switching device. Accordingly, a switching device may need to be protected from exceeding its SOA and/or maximum power rating.

A switching device is conventionally protected from damage by causing the switching device to act as a constant current generator during startup, thereby limiting magnitude of current flowing through the switching device during startup. For example, where a field effect transistor (FET) acts as a switching device, control circuitry may maintain a constant gate-to-source voltage during startup, so that the FET acts as a constant current generator during startup.

Figure 1:
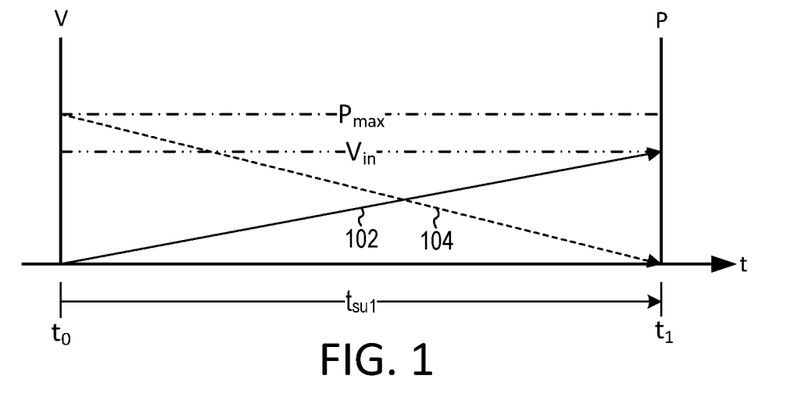
FIG. 1 is a graph illustrating output voltage and power dissipation of a switching device during startup, where the switching device is configured to act as a constant current generator.

However, operating a switching device as a constant current generator during startup may cause startup time to be undesirably long due to the limited current available for charging an energy storage device. Additionally, a maximum allowable power dissipation in the switching device may be exceeded unless the constant current magnitude is small. For example, FIG. 1 is a graph illustrating output voltage 102 and power dissipation 104 of a switching device during startup, where output voltage 102 is voltage at an output of the switching device, and power dissipation 104 is power dissipation in the switching device. Startup begins at time $t_o$ with the switching device beginning to conduct current, and startup ends at time $t_1$ when output voltage 102 is equal to input voltage $V_{in}$. The switching device in this example operates as a constant current generator and generates a current having a small magnitude, thereby preventing power dissipation 104 from exceeding a maximum allowable power dissipation $P_{max}$ of the switching device. Consequently, the switching device is protected from excessive power dissipation, and the switching devices operates within its SOA. However, startup time, i.e. time required for output voltage 102 to reach input voltage $V_{in}$ after startup begins at time $t_o$, has a relatively long value of $t_{su1}$.

Figure 2:
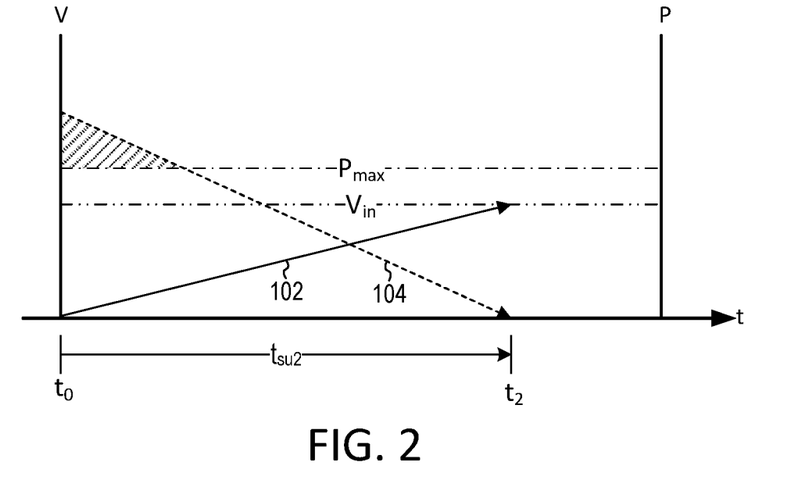
FIG. 2 is another graph illustrating output voltage and power dissipation of a switching device during startup, where the switching device is configured to act as a constant current generator.

FIG. 2 is a graph like the FIG. 1 graph, but where the switching device generates a constant current having a larger magnitude than in the FIG. 1 example. The larger constant current magnitude causes output voltage 102 to reach $V_{in}$ at time $t_2$, such that the startup time has a value $t_{su2}$. Consequentially, startup time in the FIG. 2 example is shorter than startup time in the FIG. 1 example. However, power dissipation 104 exceeds maximum allowable power dissipation P during a portion of the startup process, as shown by crosshatching in FIG. 2. While the switching device may not exceed its SOA, the large power dissipation during startup could damage the switching device.

Figure 3:
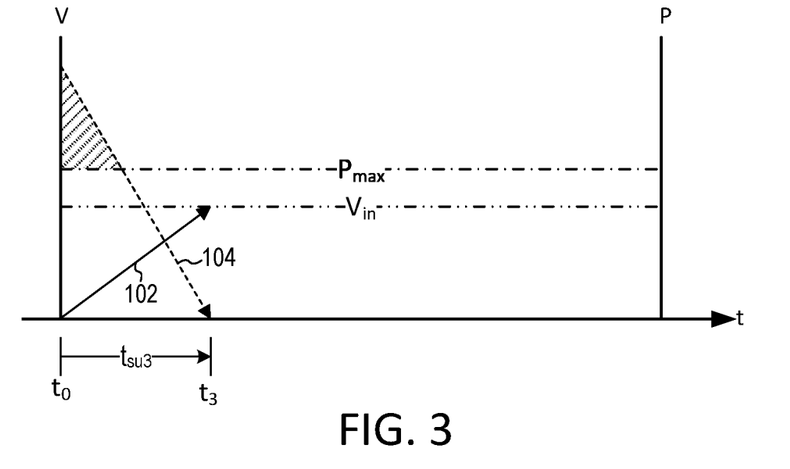
FIG. 3 is another graph illustrating output voltage and power dissipation of a switching device during startup, where the switching device is configured to act as a constant current generator.

FIG. 3 is a graph like each of the FIGS. 1 and 2 graphs, but where the switching device generates a constant current having a larger magnitude than in the examples of FIGS. 1 and 2. Consequentially, startup time $t_{su3}$ in the FIG. 3 example is shorter than startup time in either of the FIG. 1 example or the FIG. 2 example. However, power dissipation 104 significantly exceeds maximum allowable power dissipation $P_{max}$ during a portion of the startup process, as shown by crosshatching in FIG. 3. Consequently, the switching device may be subject to long term degradation and/or failure.

Accordingly, it may be difficult or even impossible to achieve both satisfactorily short startup time and adequate switching device protection, when operating a switching device as a constant current generator during startup. Operating a switching device such that it generates a constant current at two different magnitudes during startup may enable startup time to be somewhat shortened, but the drawbacks discussed above still generally apply.

Furthermore, it may be difficult to accurately control magnitude of a constant current generator that is implemented by a FET, such as due to variations in sub-threshold characteristics of the FET and/or channel modulation effects in the FET. Additionally, power dissipation in a switching device may vary significantly over startup time, especially in high voltage applications. For example, power dissipation 104 in FIGS. 1-3 changes significantly during the startup process. Consequently, the constant current generator may need to be configured to generate current having a small magnitude, to ensure that the switching device is protected under worst-case conditions. Such small current magnitude, however, limits how quickly an associated energy storage device may be charged, thereby causing long startup time.

Disclosed herein are new electrical switching systems including constant-power controllers which may at least partially overcome one or more of the drawbacks discussed above. The constant-power controllers generate a digital control signal to control a switching device. A duration of an active phase of the digital control signal is controlled at least partially based on a voltage across the switching device, to achieve a constant average power dissipation in the switching device. Additionally, a duration of the digital control signal is controlled to regulate peak magnitude of current flowing through the switching device. Accordingly, the constant-power controllers are advantageously capable of controlling a switching device to achieve both short startup time and adequate switching device protection. Additionally, certain embodiments can achieve better current control accuracy than conventional controllers for switching devices. Furthermore, some embodiments are operable with a wide range of load energy storage capacities.

Figure 4:
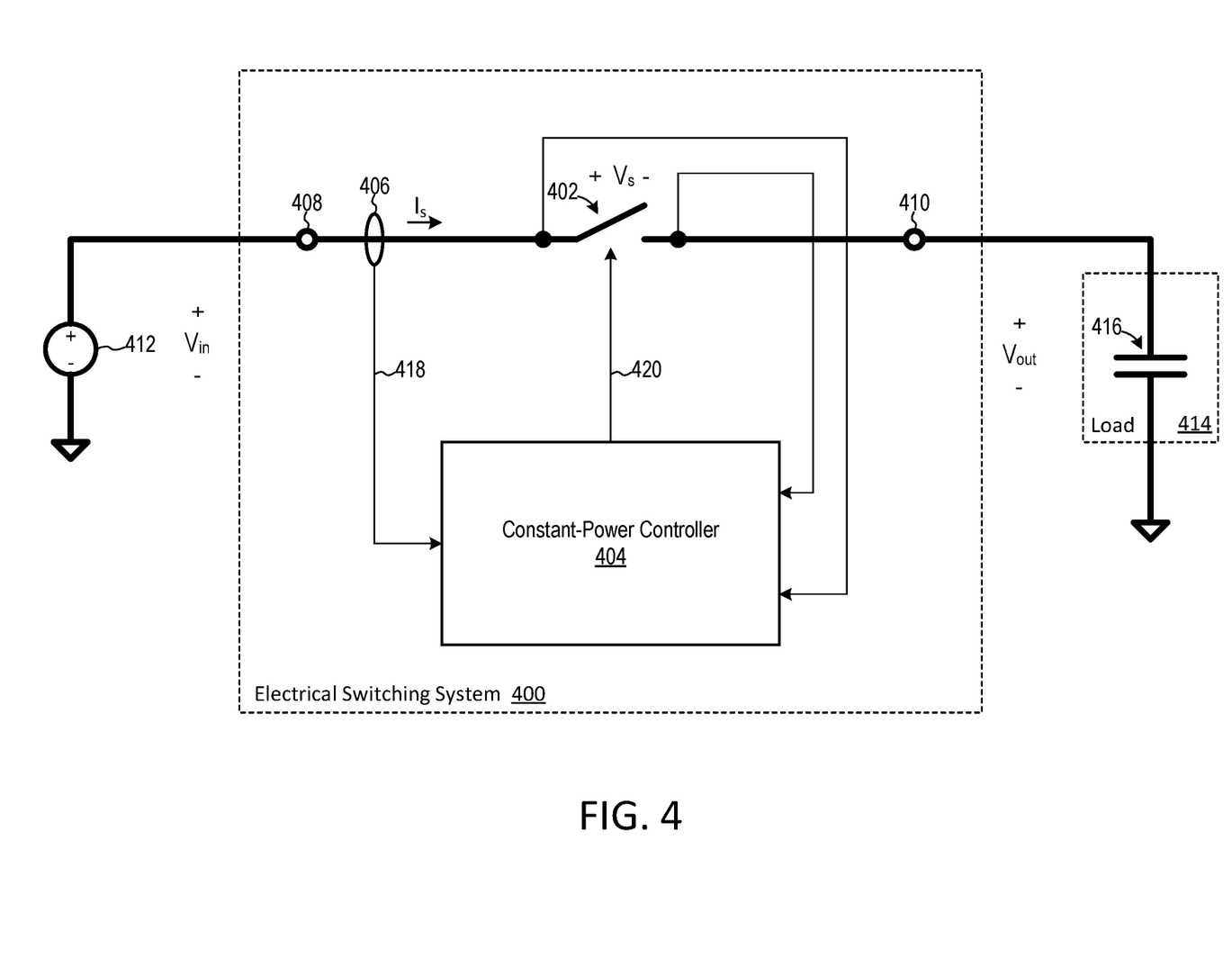
FIG. 4 is a block diagram of an electrical circuit including an electrical switching system, where the electrical switching system includes a constant-power controller, according to an embodiment.

FIG. 4 is a block diagram of an electrical circuit including an electrical switching system 400, where electrical switching system 400 is an embodiment of the new electrical switching systems disclosed herein. Electrical switching system 400 includes a switching device 402, a constant-power controller 404, and a current sense module 406. Switching device 402 is electrically coupled between a node 408 and a node 410, and an electrical power source 412 is electrically coupled to node 408. Electrical power source 412 provides electrical power having a voltage $V_{in}$ at node 408. Although electrical power source 412 is depicted as a direct current (DC) electrical power source, electrical power source 412 could take other forms without departing from the scope hereof. For example, in some alternate embodiments, electrical power source 412 is an alternating current (AC) electrical power source, such as an amplifier or a motor drive. While electrical power source 412 is separate from electrical switching system 400 in the FIG. 4 embodiment, electrical power source 412 is at least partially integrated in electrical switching system 400 in some alternate embodiments.

A load 414 is electrically coupled to node 410. Load 414 includes a capacitive component 416. However, load 410 could alternately or additionally include a resistive component, an inductive component, a battery component, and/or other consumer or source of electrical power. Although load 414 is depicted as being a single element for illustrative simplicity, load 414 could include multiple elements. For example, in some embodiments, load 414 is another system that is powered from electrical power source 412 via switching device 402.

Current sense module 406 is configured to generate a signal 418 representing magnitude of current $I_s$ flowing through switching device 402. In some embodiments, current sense module 406 includes one or more of a current sense resistor, a replica transistor, and a Hall effect sensor. While current sense module 406 is illustrated as being a discrete element, in some embodiments, current sense module 406 is at least partially integrated in one or more of switching device 402 and constant-power controller 404.

Switching device 402 is controlled by a digital control signal 420 generated by constant-power controller 404. Specifically, switching device 420 is in its on-state when digital control signal 420 is in its active phase, and switching device 420 is in its off-state when digital control signal 420 is in its inactive phase, Current $I_s$ flows through switching device 402 when the switching device is in its on-state, and no current flows through switching device 402 when the switching device is in its off-state, Switching device 402 is configured such that magnitude of current $I_s$ flowing through switching device 402 is at least partially a function of the duration of digital control signal 420. For example, in some embodiments, magnitude of current $I_s$ increases with increasing value of digital control signal 420. In some embodiments, switching device 402 includes a FET or an insulated gate bipolar junction transistor (IGBT), including a gate driven by digital control signal 420. In some other embodiments, switching device 402 includes a bipolar junction transistor (BJT) including a base driven by digital control signal 420.

Constant-power controller 404 is configured to generate digital control signal 420 such that a duration of digital control signal 420 regulates a peak magnitude of current $I_s$. Consequently, constant-power controller 404 is potentially capable of achieving more-precise control of current magnitude than conventional solutions. In some embodiments, constant-power controller 404 is configured to generate digital control signal 420 such that duration of digital control signal 420 causes peak magnitude of current $I_s$ to be $I_{stup}$. $I_{stup}$ is a predetermined value chosen to achieve a desired peak current magnitude through switching device 402 during startup of electrical switching system 400. In some embodiments, $I_{stup}$ is equal to, or is based on, a maximum magnitude of current $I_s$ that switching device 402 is capable of handling while operating within its SOA. As discussed below, in certain embodiments, constant-power controller 404 compares signal 418 to a reference signal to control the duration of digital controller signal 420 and thereby regulate peak magnitude of current $I_s$.

Additionally, constant-power controller 404 is configured to generate digital control signal 420 such that a duration of an active phase of digital control signal 420 is based at least partially on voltage $V_s$ across switching device 402, such that average power dissipation in switching device 402 is constant. For example, in some embodiments, constant-power controller 404 generates digital control signal 420 such that the duration of the active phase of digital control signal 420 decreases with increasing voltage $V_s$, e.g. such that the duration of the active phase of digital control signal 420 is inversely proportional to magnitude of voltage $V_s$, to maintain constant average power dissipation in switching device 402. In certain embodiments, constant-power controller 404 uses a pulse width modulation (PWM) technique to control the duration of the active phase of digital control signal 420 by controlling a duty cycle of digital control signal 420. In some other embodiments, constant-power controller 404 uses a pulse frequency modulation (PFM) technique to control the duration of the active phase of digital control signal 420 by controlling a frequency of digital control signal 420. Constant-power controller 404 could be configured to control the duration of the active phase of digital control signal 420 using other modulation techniques without departing from the scope hereof.

Figure 5:
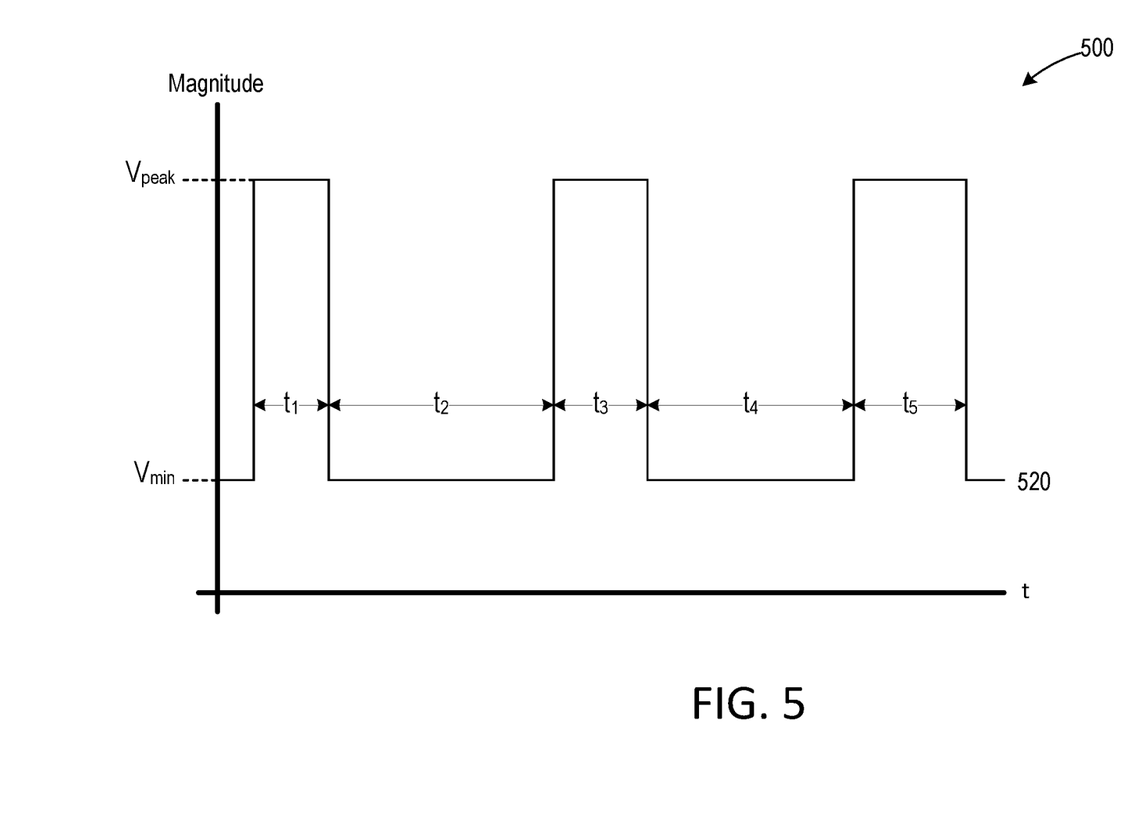
FIG. 5 is a graph illustrating one example of a digital control signal of the FIG. 4 electrical switching system during startup.

FIG. 5 is a graph 500 illustrating a digital control signal 520, which is one example of digital control signal 420. The horizontal axis of graph 500 represents time (t), and the vertical axis of graph 500 represents magnitude. Digital control signal 520 is in its active phase during time periods $t_1$, $t_3$, and $t_5$, and digital control signal 520 is in its inactive phase during time periods $t_2$ and $t_4$. Digital control signal 520 has a peak value $V_{peak}$ and a minimum value $V_{min}$. Magnitude of digital control 520 is $V_{peak}$ while digital control signal 520 is in its active phase, and magnitude of digital control signal 520 is $V_{min}$ while digital control signal 520 is in its inactive phase. In some embodiments, $V_{min}$ is zero, relative to a terminal of switching device 420. While FIG. 5 illustrates an example of digital control signal 420 being in its active phase while the digital control signal is in its high-state, constant power controller 404 could be configured such that digital control signal 420 has a different polarity without departing from the scope hereof.

Referring again to FIG. 4, in certain embodiments, constant-power controller 404 is embodied by analog and/or digital electronic circuitry (not shown). For example, in particular embodiments, constant-power controller 404 includes a processing subsystem (not shown) and a memory subsystem (not shown), and the processing subsystem executes non-transitory instructions stored in the memory subsystem to perform one or more functions of constant-power controller 404. While constant-power controller 404 is illustrated as being a discrete element, in some embodiments, constant-power controller 404 it is integrated with, or shares one or more features with, another element.

Figure 6:
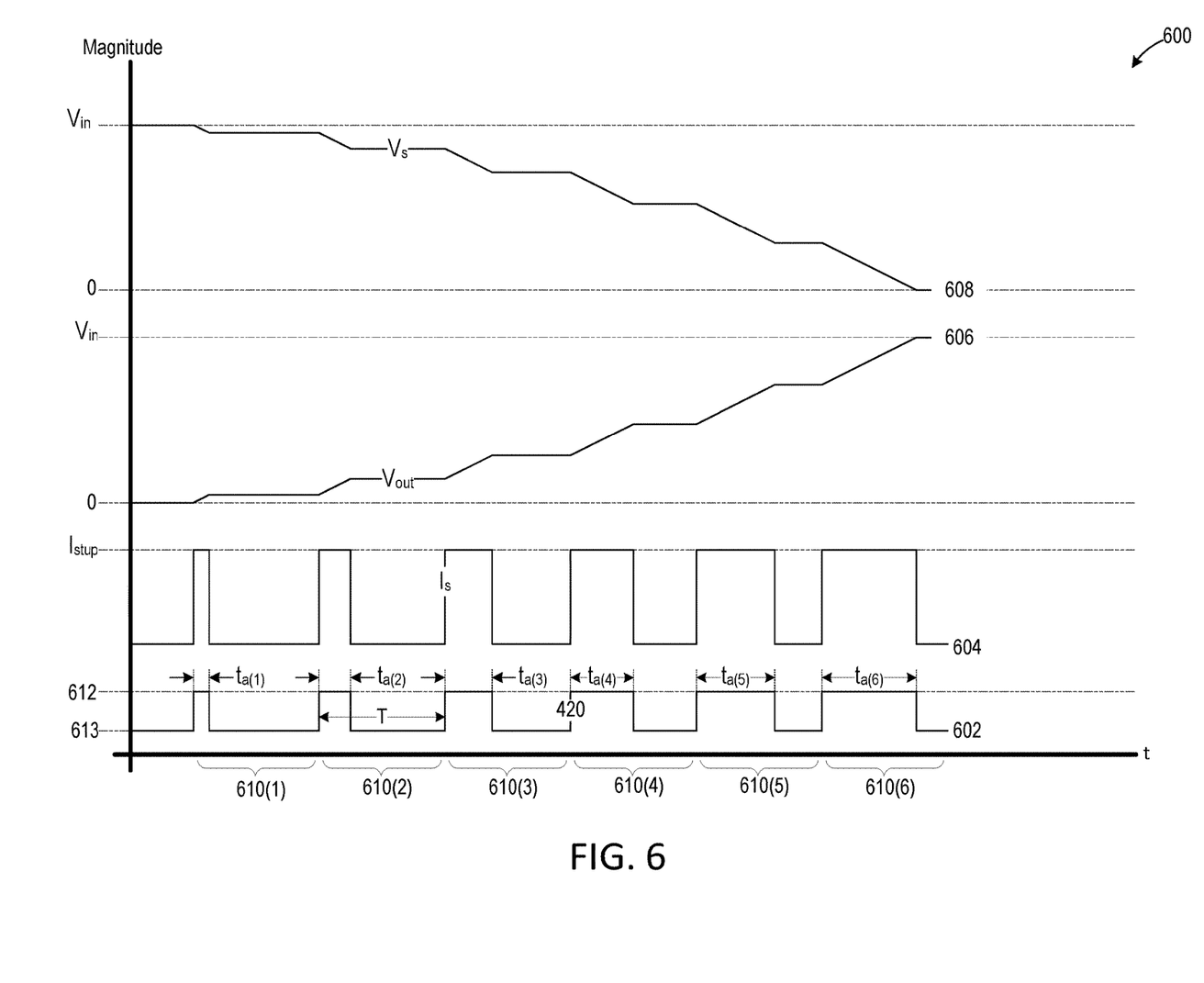
FIG. 6 is a graph illustrating one example of operation of the FIG. 4 electrical switching system during startup.

FIG. 6 is a graph 600 illustrating one example of operation of electrical switching system 400 during startup, i.e. from a time when switching device 402 begins to conduct current until a time when magnitude of output voltage $V_{out}$ reaches magnitude of input voltage $V_{in}$. The horizontal axis of graph 600 represents time (t), and the vertical axis of graph 600 represents magnitude. Graph 600 includes the following four curves: (a) curve 602 representing digital control signal 420, (b) curve 604 representing current $I_s$ flowing through switching device 402, (c) curve 606 representing output voltage $V_{out}$, and (d) curve 608 representing voltage $V_s$ across switching device 402. Constant-power controller 404 generates digital control signal 420 such that each switching cycle 610 has a period T. Accordingly, digital control signal 420 has a frequency 1/T. In this document, specific instances of an item may be referred to by use of a numeral in parentheses (e.g., switching cycle 610(1)) while numerals without parentheses refer to any such item (e.g., switching cycles 610).

Although electrical switching system 400 is depicted in FIG. 6 as requiring six switching cycles 610 to complete the startup process, electrical switching system 400 may require fewer or additional switching cycles 610 to complete the startup process, depending on the configuration of electrical switching system 400 and its operating environment. For example, number of switching cycles 610 required to complete the startup process may depend on factors including, but not limited to, (a) energy storage capacity of load 414, (b) maximum allowable power dissipation of switching device 402, (c) SOA of switching device 402, (d) frequency of digital control signal 420, and (e) magnitude of input voltage $V_{in}$.

Constant-power controller 404 generates digital control signal 420 having (a) a peak value 612 while in its active phase and (b) a value 613 when in its inactive phase. Peak value 612 is determined by constant-power controller 404 such that current $I_s$ has a magnitude $I_{stup}$ when digital control signal 420 is in its active phase, as illustrated in FIG. 6. Peak magnitude of current $I_s$ is relatively large, i.e. equal to $I_{stup}$, thereby promoting fast charging of energy storage elements in load 414. However, an average value of current $I_s$ is much smaller than $I_{stup}$. For example, an average value $I_{s\_avg}$ of current $I_s$ in switching cycle 610(1) is equal to $I_{stup}*t_{a(1)}/T$. Switching device 402 therefore dissipates relatively low average power, even though peak magnitude of current $I_s$ is relatively large, because average power dissipation and associated thermal characteristics are a function of average current magnitude and not peak current magnitude. Consequently, constant-power controller 404 advantageously enables electrical switching system 400 to achieve a combination of short startup time and low average power dissipation in switching device 402. Additionally, constant-power controller 404 can achieve a combination of short startup time and low average power dissipation in switching device 402 over a range of energy storage capacities, e.g. over a range of capacitance 416, as well as over range of input voltages $V_{in}$.

It should be appreciated that constant-power controller 404 generates digital control signal 420 such that a duration $t_a$ of an active phase of digital control signal 420 in each switching cycle 610 is a function of voltage $V_s$ across switching device 402. Specifically, length of duration $t_a$ increases as voltage $V_s$ decreases, e.g. $t_a$ is inversely proportional to voltage $V_s$ in each switching cycle 610, to enable power dissipation in switching device 402 to be constant. For example, length of duration $t_{a(2)}$ is greater than length of duration $t_{a(1)}$, because voltage $V_s$ in switching cycle 610(2) is less than voltage $V_s$ in switching cycle 610(1).

Figure 7:
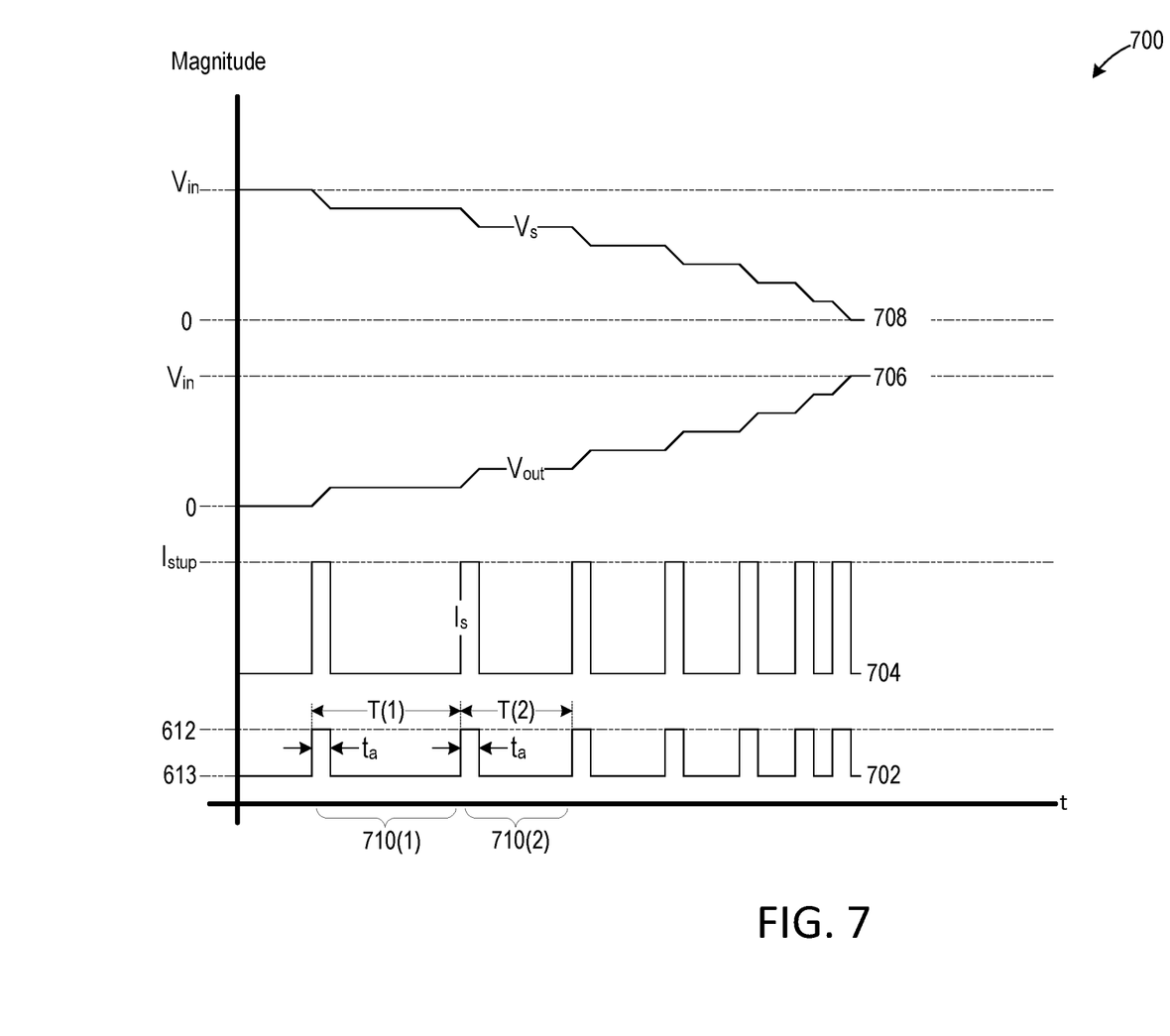
FIG. 7 is a graph illustrating another example of operation of the FIG. 4 electrical switching system during startup.

The duration of the active phase of digital control signal 420 is controlled in the FIG. 6 example using PWM, i.e. duty cycle ($t_a$/T) is controlled to control the duration of the active phase of digital control signal 420. FIG. 7, in contrast, is a graph 700 illustrating one example of operation of electrical switching system 400 during startup where constant-power controller 404 is configured to use PFM to control the duration of the active phase of digital control signal. The horizontal axis of graph 700 represents time (t), and the vertical axis of graph 700 represents magnitude. Graph 700 includes the following four curves: (a) curve 702 representing digital control signal 420, (b) curve 704 representing current $I_s$ flowing through switching device 402, (c) curve 706 representing output voltage $V_{out}$, and (d) curve 708 representing voltage $V_s$ across switching device 402. Although electrical switching system 400 is depicted in FIG. 7 as requiring seven switching cycles 710 to complete the startup process, electrical switching system 400 may require fewer or additional switching cycles 710 to complete the startup process, depending on the configuration of electrical switching system 400 and its operating environment. Only two switching cycles 710 are labeled in FIG. 7 to promote illustrative clarity.

Constant-power controller 404 generates digital control signal 420 in the FIG. 7 example such a duration of the active phase of digital control signal 420 is r a constant value $t_a$ during each switching cycle 710, or in other words, such that duration $t_a$ does not vary among switching cycles 710. However, constant-power controller 404 generates digital control signal 420 such that its frequency increases as voltage $V_s$ decreases, to achieve constant average power dissipation in switching device 402. For example, switching cycle 710(1) has a frequency 1/T(1), and switching cycle 710(2) has a higher frequency 1/T(2), as illustrated in FIG. 7. Like in the FIG. 6 example, constant-power controller 404 generates digital control signal 420 in the FIG. 7 example such that digital control signal 420 has a peak value 612 to cause current $I_s$ to have a magnitude $I_{stup}$ and thereby regulate magnitude of current $I_s$, when digital control signal 420 is in its active phase. Additionally, digital control 420 has a minimum value 613.

Figure 8:
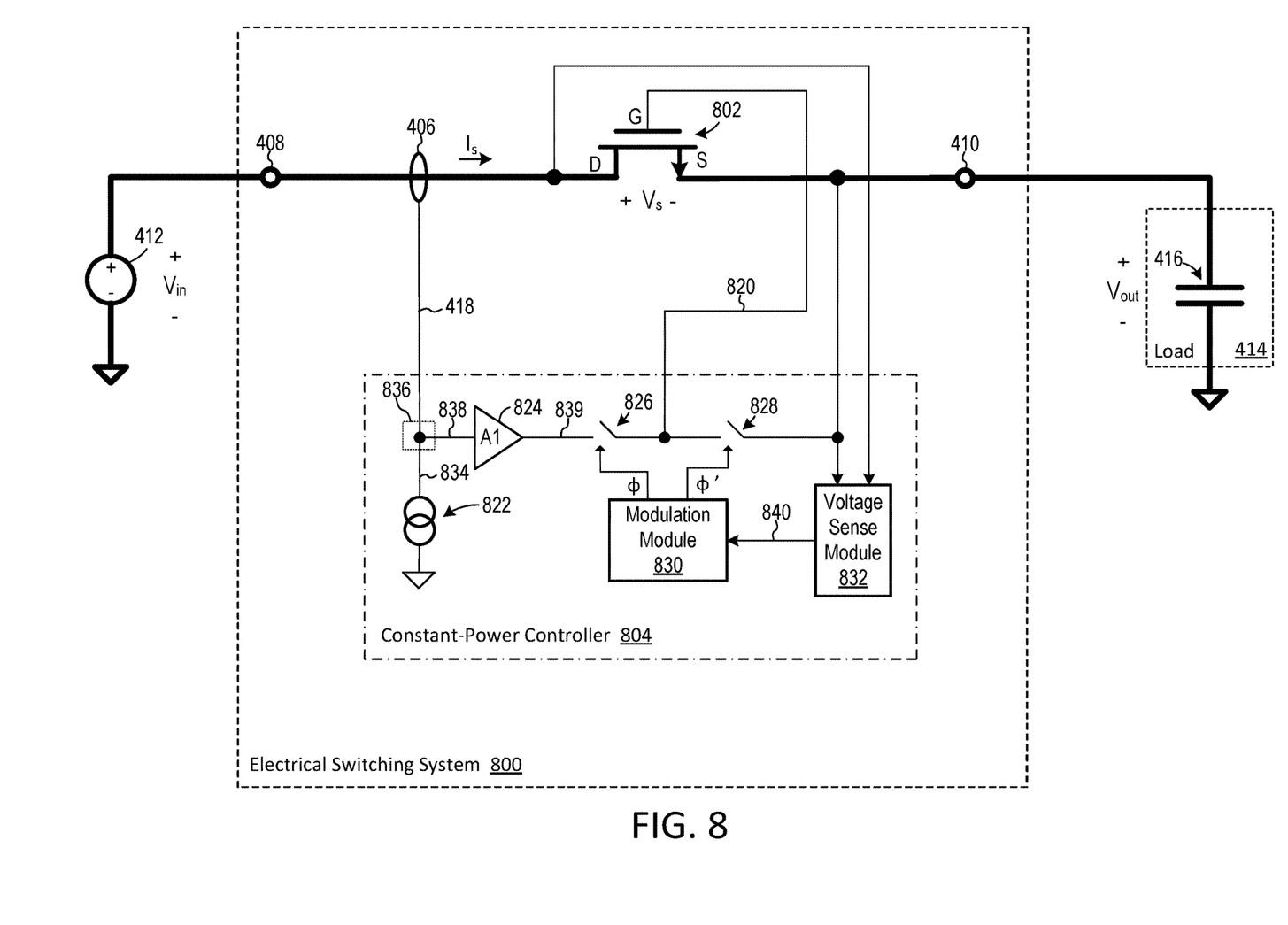
FIG. 8 is a block diagram of another electrical circuit including an electrical switching system, where the electrical switching system includes a constant-power controller, according to an embodiment.

FIG. 8 is a block diagram of an electrical circuit including an electrical switching system 800, where electrical switching system 800 is an embodiment of electrical switching system 400 of FIG. 4. Switching device 402 and constant-power controller 404 of FIG. 4 are embodied by a FET 802 and a constant-power controller 804, respectively, in FIG. 8. FET 802 is an n-channel, enhancement-mode, metal oxide semiconductor field effect transistor (MOSFET). A drain (D) of FET 802 is electrically coupled to node 408, and a source (S) of FET 802 is electrically coupled to node 410. A gate (G) of FET 802 is electrically coupled to constant-power controller 804, and gate G is driven by a digital control signal 820 generated by constant-power controller 804, where digital control signal 820 is an embodiment of digital control signal 420. FET 802 could be replaced with a different type of FET, including but not limited to, a p-channel enhancement-mode MOSFET, a depletion-mode MOSFET, or a junction field effect transistor (JFET), without departing from the scope hereof.

Constant-power controller 804 includes a current generator 822, an amplifier 824, a driver switch 826, a driver switch 828, a modulation module 830, and a voltage sense module 832. Current generator 822 is configured to generate a reference signal 834 representing $I_{stup}$. For example, in some embodiments, reference signal 834 is a scaled value of $I_{stup}$. A comparison module 836 is configured to generate a signal 838 representing a difference between reference signal 834 and signal 418 from current sense module 406. Comparison module 836 is implemented by a node that subtracts reference signal 834 from signal 418, to generate signal 838, in FIG. 8. However, comparison module 836 could be implemented in other manners, e.g. with analog electronic circuitry and/or digital electronic circuitry, without departing from the scope hereof.

Amplifier 824 amplifies signal 838 to yield a signal 839, which is received by driver switch 826. Amplifier 824 is included, for example, (a) to boost signal 838 so that the signal can provide a positive gate-to-source voltage at FET 802, and/or (b) to boost signal 838 so that signal 838 is capable of quickly charging capacitance of gate G. Amplifier 824 is optionally omitted in embodiments where signal 838 does not need to be boosted to drive a switching device.

Voltage sense module 832 generates a signal 840 representing a voltage $V_s$ across switching device (FET) 802, i.e. a voltage between drain D and source S of FET 802. Driver switches 826 and 828 collectively generate digital control signal 820 from signal 839, in response to control signals φ and φ', respectively, where control signals φ and φ' are complementary. Driver switch 826 is closed when control signal (I) is asserted, such that a magnitude of digital control signal 820 is equal to magnitude of signal 839. Driver switch 826 is open when control signal (I) is de-asserted. Driver switch 828 is closed when signal φ' is asserted, such that magnitude of digital control signal 820 is zero relative to source S of FET 802. Driver switch 828 is open when signal φ' is de-asserted. Accordingly, driver switches 826 and 828 are configured such that (a) digital control signal 820 has a magnitude equal to that of signal 839 when digital control signal 820 is in its active phase, and (b) digital control signal 820 has a magnitude of zero when digital control signal 820 is in its inactive phase.

Modulation module 830 is configured to generate control signals φ and φ' and thereby control driver switches 826 and 828, at least partially based on signal 840. In particular, modulation module 830 increases an amount of time that control signal (I) is asserted as voltage $V_s$ decreases, and modulation module 830 decreases an amount of time that control signal (I) is asserted as voltage $V_s$ increases. In some embodiments, modulation module 830 generates control signal φ such that an amount of time that control signal φ is asserted is inversely proportional to magnitude of voltage $V_s$. As discussed above, control signals φ and φ' are complementary, and control signal φ' is de-asserted when control signal φ is asserted, and vice versa. In some embodiments, modulation module 830 is configured to use a PWM technique or a PFM technique to generate control signals φ and φ', but modulation module 830 could be configured to use a different modulation technique without departing from the scope hereof.

Constant-power controller 804 is implemented, for example, by analog and/or digital electronic circuitry. In some embodiments, two or more of the elements of constant-power controller 804 are at least partially embodied by common electronic circuitry. In particular embodiments, constant-power controller 804 includes a processing subsystem (not shown) and a memory subsystem (not shown), and the processing subsystem executes non-transitory instructions stored in the memory subsystem to perform one or more functions of constant-power controller 804.

Figure 9:
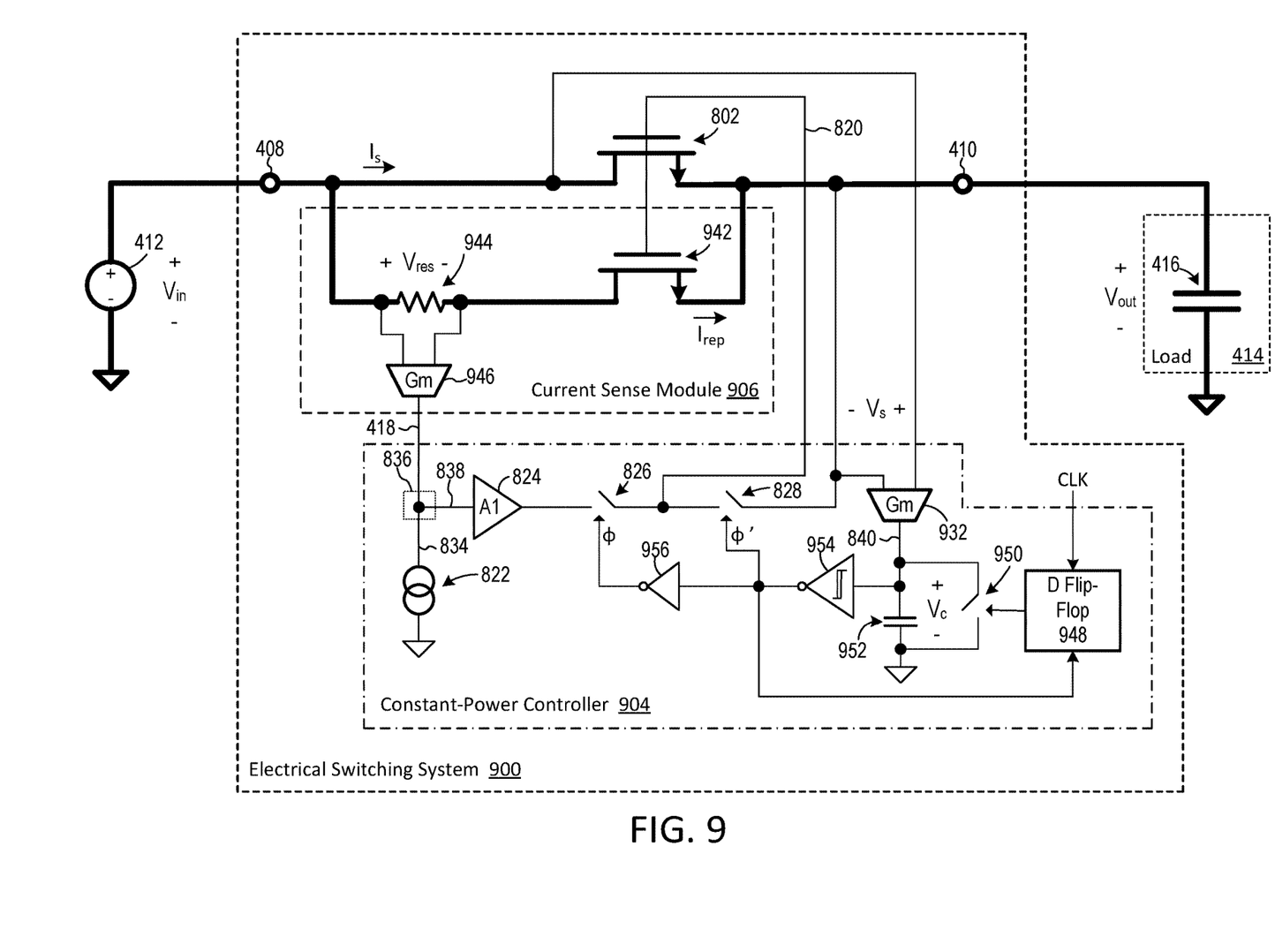
FIG. 9 is a block diagram of another electrical circuit including an electrical switching system, where the electrical switching system includes a constant-power controller, according to an embodiment.
Figure 10:
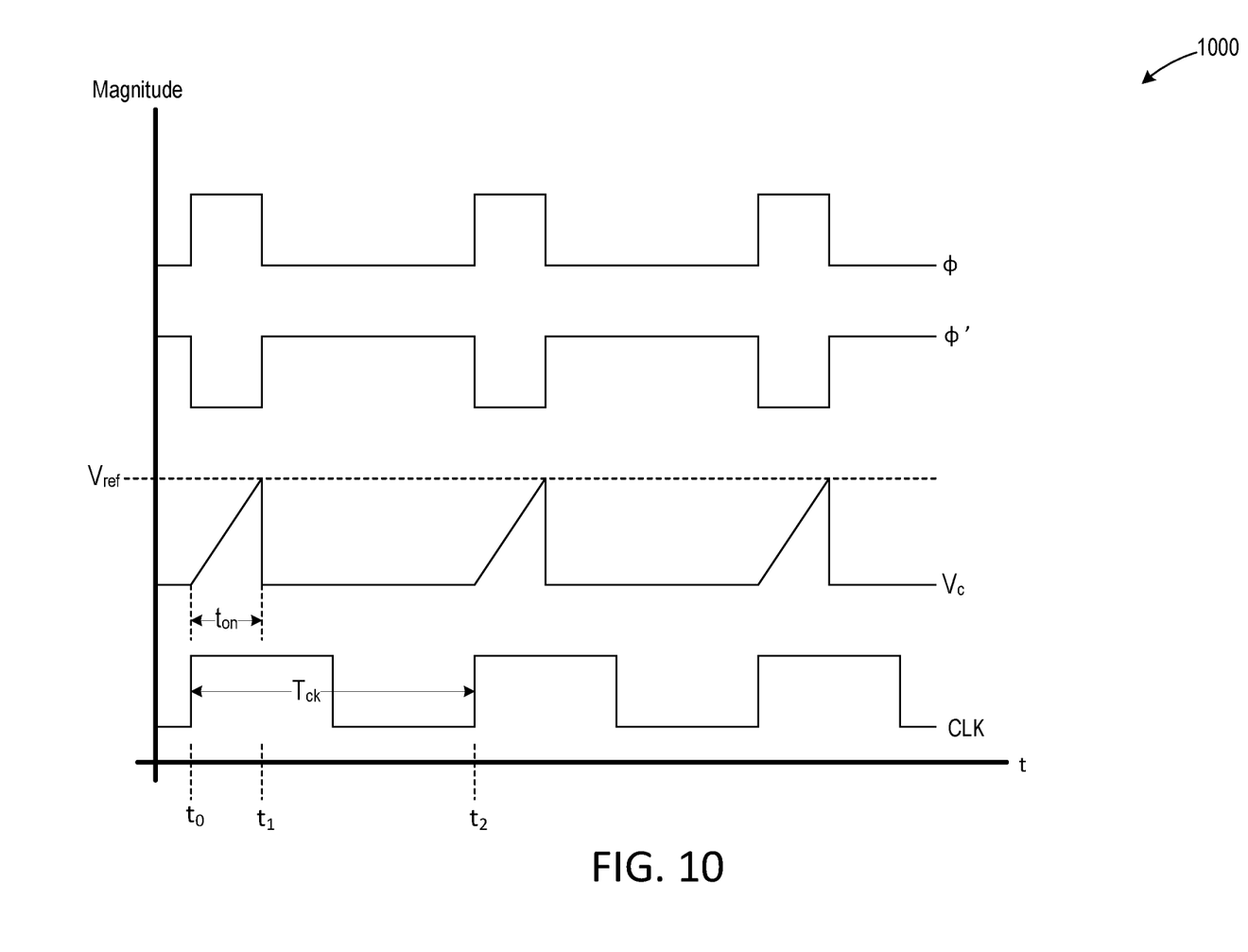
FIG. 10 is a graph illustrating one example of operation of the constant-power controller of FIG. 9.

FIG. 9 is a block diagram of an electrical circuit including an electrical switching system 900, where electrical switching system 900 is an embodiment of electrical switching system 800 of FIG. 4. Current sense module 406 and constant-power controller 804 of FIG. 8 are embodied by a current sense module 906 and a constant-power controller 904, respectively, in FIG. 9. FIG. 10 is a graph 1000 illustrating one example of operation of constant-power controller 904 over several clock cycles where voltage $V_s$ is essentially constant (which is typically only true for short periods of time). A horizontal axis of graph 1000 represents time (t), and a vertical axis of graph 1000 represents magnitude FIGS. 9 and 10 are best viewed together in the following discussion.

Current sense module 906 includes a replica transistor 942, a current sense resistor 944, and a transconductance gain stage 946. Replica transistor 942 is electrically coupled in parallel with FET 802 via current sense resistor 944. Current sense resistor 944 has a low resistance value so that it has negligible effect on current $I_{rep}$ flowing through replica transistor 942. Replica transistor 942 is configured such that current $I_{rep}$ flowing through replica transistor 942 has a known relationship to current $I_s$. For example, in some embodiments, current $I_{rep}$ is a scaled value of current $I_s$. Consequentially, voltage $V_{res}$ across current sense resistor 944 is proportional to current $I_s$. Transconductance gain stage 946 amplifies voltage $V_{res}$ to generate signal 418 representing current flowing through switching device (FET) 802.

Constant power controller 904 includes a transconductance gain stage 932 embodying voltage sense module 832 of FIG. 8. Transconductance gain stage 932 amplifies voltage $V_s$ to generate signal 840 representing voltage ($V_s$) across switching device (FET) 802, such that signal 840 is a current signal. Constant power controller 904 further includes a D flip-flop 948, a switch 950, a capacitor 952, a trigger 954, and an inverter 956, which collectively form one embodiment of modulation module 830 of FIG. 8.

Flip-flop 948 receives a clock signal CLK, where clock signal CLK is either generated internal to electrical switching system 900 or external to electrical switching system 900. For example, some embodiments of electrical switching system 900 further include a clock (not shown) configured to generate clock signal CLK. A rising edge of clock signal CLK sets flip-flop 948 at time to as shown in FIG. 10, thereby causing switch 950 to open. Capacitor 952 therefore begins to charge from signal 840, and voltage $V_c$ across capacitor 952 accordingly increases with time, as shown in FIG. 10. An output of trigger 954 is low during charging of capacitor 952, such that control signal φ' is de-asserted. Inverter 956 inverts the output of trigger 954, such that control signal φ is asserted during charging of capacitor 952, as shown in FIG. 10.

Trigger 954 changes state in response to voltage $V_c$ across capacitor 952 reaching a threshold value $V_{ref}$ at time $t_1$ (FIG. 10), and the output of trigger 954 goes high, resulting in control signal φ being de-asserted and control signal φ' being asserted. The high output of trigger 954 resets flip-flop 948, which causes switch 950 to close and discharge capacitor 952. The above-described process repeats on the next rising edge of clock signal CLK at time $t_2$ (FIG. 10). Accordingly, D flip-flop 948, switch 950, capacitor 952, trigger 954, and inverter 956 collectively implement a modulation module which operates according to PWM.

Time $t_{on}(t)$ required to charge capacitor 952 is defined as follows, where $C_{952}$ is capacitance of capacitor 952 and $i_{840}(t)$ is magnitude of signal 840:

$$t_{on}(t) = \frac{C_{952}}{i_{840}(t)} \cdot V_{ref} \quad \text{(EQN. 1)}$$

Duty cycle $\delta(t)$ of digital control signal 820 is defined as follows, where $T_{ck}$ is a period of clock signal CLK and Gm is transconductance of transconductance gain stage 932:

$$\delta(T) = \frac{t_{on}(t)}{T_{ck}} = \frac{C_{952} \cdot V_{ref}}{T_{ck} \cdot Gm} \cdot \frac{1}{V_s(t)} \quad \text{(EQN. 2)}$$

Current $I_s(t)$ flowing through FET 802 and power P(t) dissipated in FET 802 can determined as follows:

$$I_s(t) = I_{stup} \cdot \delta(t) \quad \text{(EQN. 3)}$$

$$P(t) = I_s(t) \cdot V_s(t) \quad \text{(EQN. 4)}$$

EQNS. 2 and 3 can be substituted into EQN. 4 to yield the following:

$$P(t) = I_{stup} \cdot \frac{C_{952} \cdot V_{ref}}{T_{ck} \cdot Gm} \cdot \frac{1}{V_s(t)} \cdot V_s(t) \quad \text{(EQN. 5)}$$

EQN. 5 can be simplified to yield EQN. 6, where γ defined by EQN. 7, as follows:

$$P(t) = I_{stup} \cdot \gamma \quad \text{(EQN. 6)}$$

$$\gamma = \frac{C_{952} \cdot V_{ref}}{T_{ck} \cdot Gm} \quad \text{(EQN. 7)}$$

Each of $I_{stup}$ and γ of EQN. 6 is a constant, and it follows that power P(t) dissipated in FET 802 is necessarily also a constant. Accordingly, EQN. 6 shows that constant-power controller 904 achieves constant power dissipation in switching device (FET) 802 during startup.

Figure 11:
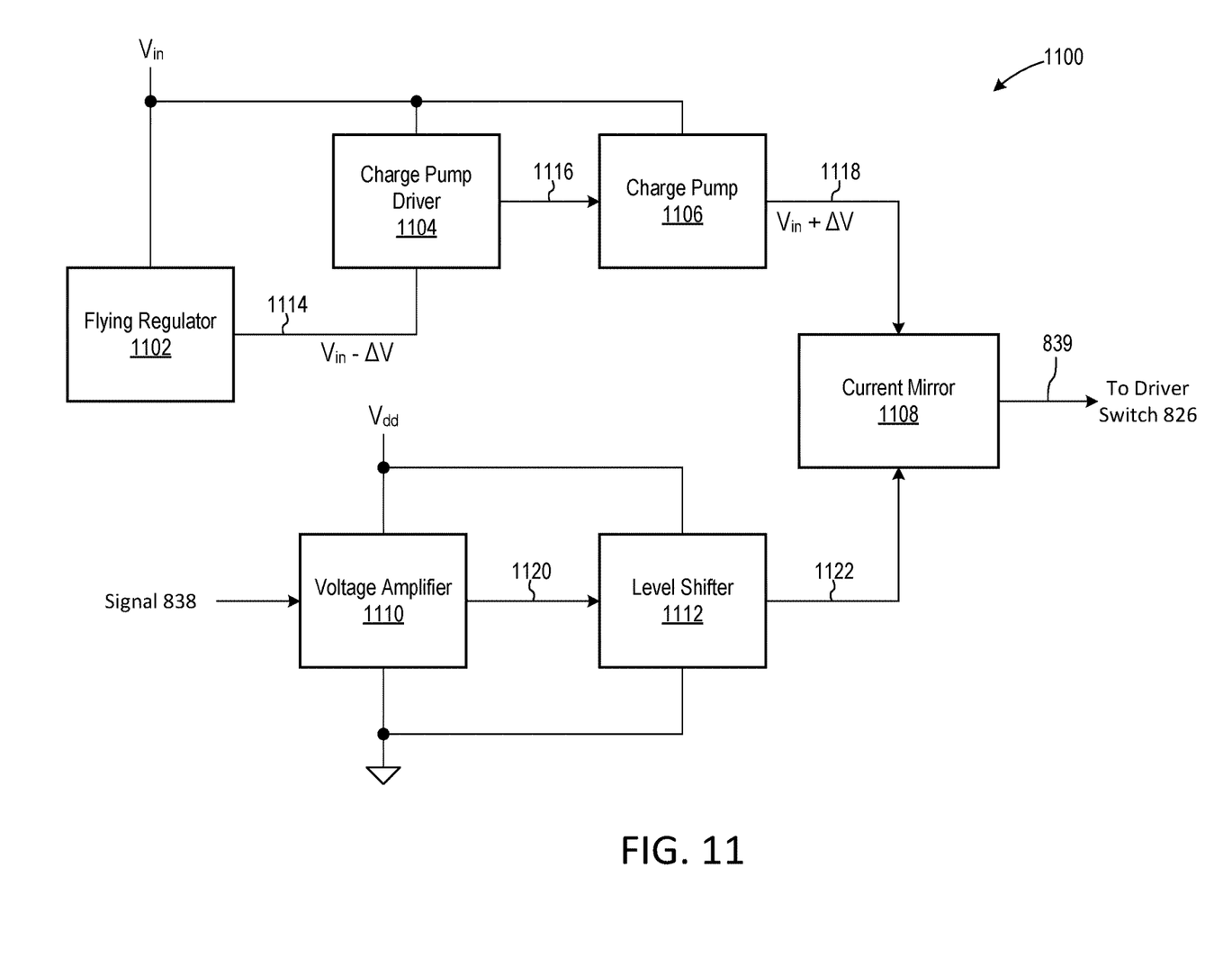
FIG. 11 is a block diagram of one possible embodiment of an amplifier depicted in FIGS. 8 and 9.

FIG. 11 is a block diagram of an amplifier 1100, which is one possible embodiment of amplifier 824 (FIGS. 8 and 9). It is understood, however, that amplifier 824 could be embodied in other manners. Amplifier 1100 includes a flying regulator 1102, a charge pump driver 1104, a charge pump 1106, a current mirror 1108, a voltage amplifier 1110, and a level shifter 1112. Flying regulator 1102, charge pump driver 1104, and charge pump 1106 collectively form a power supply for powering current mirror 1108. Specifically, flying regulator 1102 generates a reference power rail 1114 from input voltage $V_{in}$ (provided by electrical power source 412), where reference power rail 1114 has a voltage equal to $V_{in}-\Delta V$. In some embodiments, $\Delta V$ is five volts. Charge pump driver 1104 is powered between $V_{in}$ and reference power rail 1114, and charge pump driver 1104 generates a signal 1116 for driving charge pump 1106. Charge pump 1106 generates a power rail 1118 having a voltage equal to $V_{in}+\Delta V$, which powers current mirror 1108.

Each of voltage amplifier 1110 and level shifter 1112 is powered between a $V_{dd}$ power rail and ground, where the $V_{dd}$ power rail is different from the $V_{in}$ power rail. Voltage amplifier 1110 amplifies signal 838 from comparison module 836 to generate an amplified signal 1120, and level shifter 1112 shifts voltage of amplified signal 1120 to generate level-shifted signal 1122. Current mirror 1108 generates signal 839 from level-shifted signal 1122.

Figure 12:
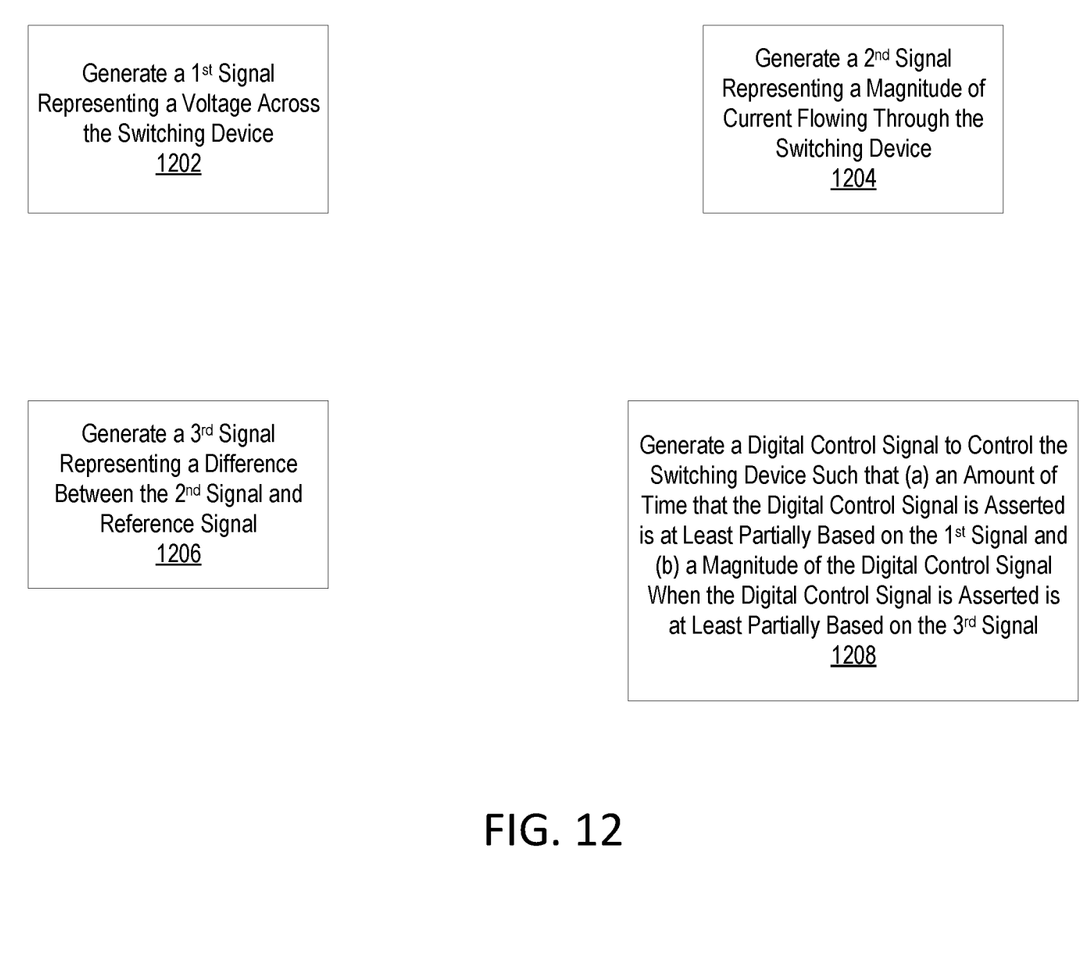
FIG. 12 is a block diagram illustrating a method for constant-power control of a switching device, according to an embodiment.

FIG. 12 is a block diagram illustrating a method 1200 for constant-power control of a switching device. In a block 1202, a first signal representing a voltage across the switching device is generated. In one example of block 1202, voltage sense module 832 generates signal 840 representing voltage $V_s$ across FET 802 (FIG. 8). In a block 1204, a second signal representing a magnitude of current flowing through the switching device is generated. In one example of block 1204, current sense module 406 generates signal 418 representing magnitude of current $I_s$ flowing through switching device 802. In a block 1206, a third signal representing a difference between the second signal and a reference signal is generated. In one example of block 1206, comparison module 836 generates a signal 838 representing a difference between reference signal 834 and signal 418 from current sense module 406.

In a block 1208, a digital control signal to control the switching device is generated such that (a) an amount of time that the digital control signal is asserted is at least partially based on the first signal and (b) a magnitude of the digital control signal when the digital control signal is asserted is at least partially based on the third signal. In one example of block 1208, modulation module 830 and driver switch 826 generate digital control signal 820 such that (a) a duration of an active phase of digital control signal 820 is based on signal 840 and (b) a peak value of digital control signal 820 is equal to signal 839.

FIG. 12 is not intended to require that its constituent blocks be executed in any particular order. Furthermore, at least some of the blocks are executed concurrently, in some embodiments.

While constant-power controllers 404, 804, and 904 are discussed above with respect to startup, the constant-power controllers are not limited to use during startup. To the contrary, the constant-power controllers could potentially be used in other situations, such as during electrical circuit shut-down or during an electrical circuit overload condition. For example, constant-power controller 404 of FIG. 4 could be adapted to generate digital control signal 420 such that power dissipation in switching device 402 is constant during an overload condition at load 414.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. An electrical switching system, comprising:
a switching device electrically coupled between a first node and a second node; and
a constant-power controller that generates a pulse width modulated signal to control the switching device and
(a) set a duration (ta) of the pulse width modulated signal during an active phase, at least partially based on a voltage ($V_s$) across the switching device, and
(b) set an amplitude of the pulse width modulated signal to regulate peak amplitude of current ($I_s$) flowing through the switching device;
wherein the constant-power controller being configured to control peak value of the pulse width modulated signal based on a difference between (a) a signal representing magnitude of current ($I_s$) flowing through the switching device and (b) a reference signal.

2. The electrical switching system of claim 1, the constant-power controller further setting duration ($t_a$) of the pulse width modulated signal in the active phase at least partially by controlling duty cycle ($t_a/T$) of the pulse width modulation signal.

3. The electrical switching system of claim 1, the constant-power controller further setting duration ($t_a$) of the pulse width modulated signal in the active phase at least partially by controlling frequency (1/T) of the pulse width modulated signal.

4. The electrical switching system of claim 1, wherein the constant-power controller amplifies difference between the signal representing magnitude of current ($I_s$) flowing through the switching device and the reference signal, to determine the peak value.

5. The electrical switching system of claim 4, the constant-power controller further setting the pulse width modulated signal to have zero value when the pulse width modulated signal is in an inactive phase.

6. The electrical switching system of claim 1, wherein the switching device comprises a field effect transistor (FET).

7. The electrical switching system of claim 6, wherein the constant-power controller comprises:
a voltage sense module that generates a first signal representing voltage ($V_s$) across the switching device;
a comparison module that generates a third signal representing difference between (a) a second signal representing magnitude of current ($I_s$) flowing through the switching device and (b) a reference signal;
first and second driver switches generating the pulse width modulated signal from the third signal; and
a modulation module setting the first and second driver switches at least partially based on the first signal.

8. A constant-power control method of a switching device, comprising:
generating a first signal representing voltage ($V_s$) across the switching device;
generating a second signal representing magnitude of current ($I_s$) flowing through the switching device;
generating a third signal representing difference between the second signal and a reference signal; and
generating a pulse width modulated signal to control the switching device such that:
duration ($t_a$) of the pulse width modulation signal in an active phase is at least partially based on the first signal, and
peak value of the pulse width modulation signal is at least partially based on the third signal.

9. The method of claim 8, further comprising controlling the duration ($t_a$) of the active phase at least partially by controlling duty cycle ($t_a/T$) of the pulse width modulation signal.

10. The method of claim 8, further comprising controlling the duration ($t_a$) of the active phase at least partially by controlling a frequency (1/T) of the pulse width modulation signal.

11. The method of any one of claim 10, further comprising amplifying the third signal.

12. The method of claim 11, wherein the pulse width modulation signal equals the third signal when the pulse width modulation signal is in its active phase.

13. The method of claim 12, wherein the pulse width modulation signal has zero value when the pulse width modulation signal is in its inactive phase.

14. A constant-power controller, comprising:
a voltage sense module that generates a first signal representing voltage ($V_s$) across a switching device;
a comparison module that generates a third signal representing difference between (a) a second signal representing magnitude of current ($I_s$) flowing through the switching device and (b) a reference signal;
first and second driver switches that generate a pulse width modulation signal based on the third signal, to control the switching device; and
a modulation module configured to control the first and second driver switches such that duration ($t_a$) of an active phase of the pulse width modulation signal is at least partially based on the first signal.

15. The constant-power controller of claim 14, the modulation module controlling the duration ($t_a$) of the pulse width modulation signal in the active phase at least partially by controlling duty cycle ($t_a/T$) of the pulse width modulation signal.

16. The constant-power controller of claim 14, the modulation module controlling the duration ($t_a$) of the pulse width modulation signal in the active phase at least partially by controlling frequency (1/T) of the pulse width modulation signal.

17. The constant-power controller of claim 16, further comprising an amplifier that amplifies the third signal before receipt of the third signal by the first driver switch.

18. The constant-power controller of claim 17, wherein the first and second driver switches generate the pulse width modulation signal such that the pulse width modulation signal has zero value when the pulse width modulation signal is in its inactive phase.

19. The constant-power controller of claim 14, wherein the switching device comprises a field effect transistor (FET).

\* \* \* \* \*